United States Patent [19]

Da Franca et al.

[11] Patent Number: 5,008,674

[45] Date of Patent: Apr. 16, 1991

[54] DIGITAL-TO-ANALOG CONVERTER USING SWITCHED CAPACITOR AND TRANSVERSE FILTER

[75] Inventors: Jose D. A. E. Da Franca; Joao P. C. C. Vital; Carlos M. D. A. D. A. Leme, all of Lisbon, Portugal

[73] Assignee: British Telecommunications, London, England

[21] Appl. No.: 362,981

[22] Filed: Jun. 8, 1989

[30] Foreign Application Priority Data

Jun. 3, 1988 [GB] United Kingdom ............... 8813162

[51] Int. Cl.[5] .......................................... H03M 1/82
[52] U.S. Cl. ................................. 341/150; 341/144
[58] Field of Search ............... 341/126, 144, 150, 152, 341/153

[56] References Cited

U.S. PATENT DOCUMENTS

| | | | |
|---|---|---|---|
| 3,500,215 | 3/1970 | Leuthold et al. | 341/144 |
| 3,543,009 | 11/1970 | Voeleker, Jr. | 341/153 |
| 4,499,594 | 2/1985 | Lewinter | 341/126 |
| 4,547,762 | 10/1985 | Ono | 341/144 |
| 4,584,568 | 4/1986 | Zomorrodi | 341/150 |
| 4,682,149 | 7/1987 | Larson | 341/153 |
| 4,851,844 | 7/1989 | Akagiri | 341/150 |
| 4,853,698 | 8/1989 | Roessler | 341/150 |

FOREIGN PATENT DOCUMENTS 57-99821  6/1982  Japan ................................ 341/150

Primary Examiner—A. D. Pellinen
Assistant Examiner—H. L. Williams
Attorney, Agent, or Firm—Nixon & Vanderhye

[57] ABSTRACT

The converter incorporates a transversal filter. The filter delays are implemented in digital form prior to conversion into analog signals (preferably using switched capacitor techniques). One form of switched capacitor converter (with or without filtering) employs a single capacitor, common to a plurality of bits, appropriate weighting of the bits being achieved by controlling the switching.

8 Claims, 6 Drawing Sheets (a)

DIGITAL-TO-ANALOG CONVERTER USING SWITCHED CAPACITOR AND TRANSVERSE FILTER

BACKGROUND OF THE INVENTION

The present invention relates to digital-to-analogue converters and digital-to-analogue converters incorporating a filtering function and is particularly (though not exclusively) concerned with their implementation using switched-capacitor techniques.

A typical, conventional arrangement is shown in FIG. 1, where successive sample values of a w-bit digital word $[b_0 b_1 \ldots b_i \ldots b_{w-1}]$ are supplied to a digital-to-analogue converter (DAC) 1 followed by an analogue FIR (finite impulse response) filter 2, based on a conventional tapped delay line structure with delays $z^{-1}$, filter coefficient multipliers $h_o \ldots h_{N-1}$ and an adder (or of course a parallel structure may be used). The coefficients are selected to give any desired filter response; in general this will be a baseband response from DC to half the sampling frequency $F_s$, followed by some rejection of unwanted frequencies above $F_s/2$.

The DAC may employ switched capacitor techniques (as described for example in Roubik Gregorian—"High Resolution Switched Capacitor D/A Converter"—Microelectronics Journal, Vol. 12, No. 2, 1981 Mackintosh Publ. Ltd.); in the filter, the analogue delays may also be realised by switched-capacitor elements. The realisation of the analogue delays may however not be ideal.

SUMMARY OF THE INVENTION

According to one aspect of the present invention there is provided an apparatus for producing a filtered analogue output signal from a digital input signal, comprising
digital-to-analogue conversion means;
delay means for producing a plurality of mutually delayed signals;
means for forming the sum of the mutually delayed signals, weighted by factors corresponding to a desired filter response; characterised in that
the delay means precedes the digital to analogue conversion means and the digital to analogue conversion means is arranged to convert each of the mutually delayed digital signals into analogue form.

In another aspect, the invention provides a switched-capacitor digital-to-analogue converter comprising inputs for receiving signals representing respective bits of a digital signal, respective switching means for supplying charge to capacitance in dependence of the states of those bits, and means for generating an analogue output signal representing the sum of these charges, characterised in that the said capacitance is a single capacitance common to all the bits and that the switching means are arranged to supply charge to the capacitor for respective different total switching times such that the charges supplied are weighted according to the significance of the bits.

BRIEF DESCRIPTION OF THE DRAWINGS

Some embodiments of the present invention will now be described, by way of example, with reference to the accompanying drawings, in which.

DETAILED DESCRIPTION OF THE DRAWING

Figure 1:
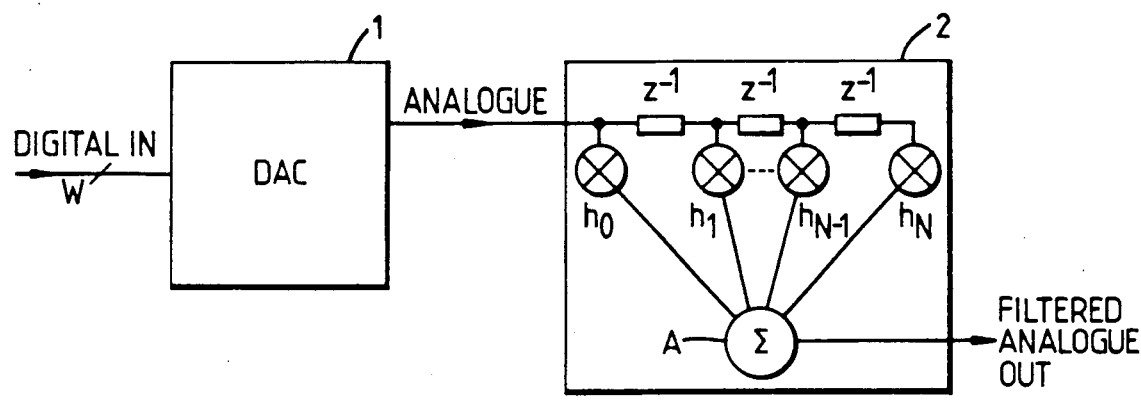
FIG. 1 is a block diagram of a conventional arrangement of a digital-to-analogue converter in combination with an analogue finite impulse response filter.
Figure 2:
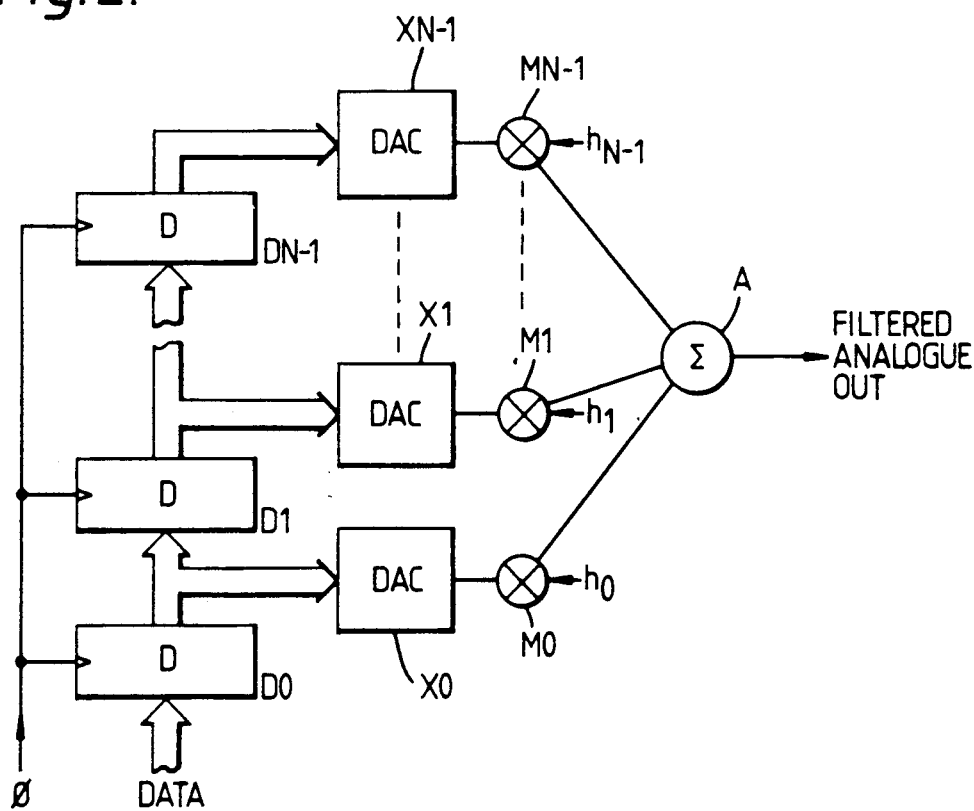
FIG. 2 is a block diagram of one form of filtered digital-to-analogue converter according to the invention.

The filtered digital-to-analogue conversion apparatus shown in FIG. 2 receives, as does that of FIG. 1, successive w-bit digital samples of a signal to be converted. The digital words are fed to a chain of N w-bit wide D-type bistable flip-flops D0 . . . DN−1 which are clocked at sampling rate $F_s$ with clock pulses $\phi$, so that a digital word, delayed by a respective number of sample periods, is available at the output of each flip-flop. These outputs are converted into analogue form by digital-to-analogue converters X0 . . . XN−1 which produce at their outputs successive analogue samples corresponding to the digital samples supplied to them. The analogue outputs are multiplied by respective filter coefficients $h_o \ldots h_{N-1}$; multipliers M0 . . . MN−1 are shown though in practice it may be more convenient to achieve the same effect by applying appropriate reference voltages to the converters X0 etc. The weighted analogue values are then summed in an adder A.

It will be seen that the arrangement of FIG. 2 performs the same conversion and filtering function of the FIG. 1 arrangement, but realises the necessary delays digitally in a simple manner, at the expense however of increasing the number of digital-to-analogue converters to N (the length of the desired filter impulse response).

In principle, any suitable digital-to-analogue converters may be used for the converters X0 . . . XN−1, but preferably switched capacitor converters such as the (known) converter shown in FIG. 3 may be employed.

Figure 3:
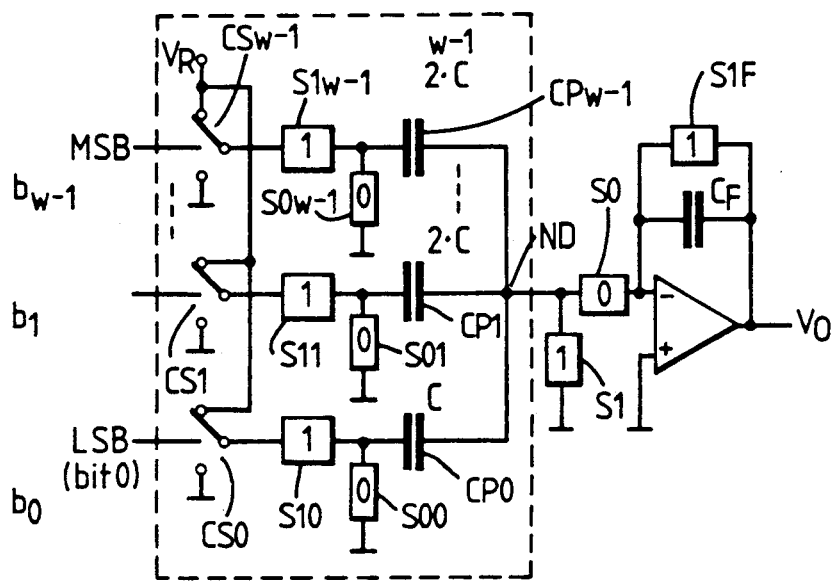
FIG. 3 is a circuit diagram of a known switched-capacitor unit which may be employed in the converter of FIG. 1.
Figure 3A:
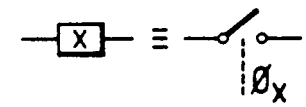
FIG. 3a illustrates clock pulses used by the unit of FIG. 3.

In FIG. 3, the input bits of a w-bit digital word are designated $b_o \ldots b_{w-1}$ and each serves to switch, according to its binary value, an electronic switch CS0 . . . CSw−1 (shown schematically) between zero volts (referred to below as "ground") and a reference voltage $V_R$. The converter contains a number of electronic switches controlled by the non-overlapping two-phase clock pulses $\phi_o$, $\phi_1$ at the sampling frequency $F_S$, which are shown in FIG. 3a. In FIG. 3 and elsewhere, the switches are shown as rectangles containing 0 or 1 indicating that the switch is closed during clock phase 0 or 1 respectively. Using the suffix i to indicate generically the components handling signals from one bit ($b_i$) of the input bits $b_0 \ldots b_{w-1}$, the output of each switch CSi is connected via a switch Sli controlled by $\phi_1$ to one side of a capacitor CPi, which is also connected to ground via a switch SOi controlled by $\phi_0$. The other side of each capacitor CPi is connected to a common node ND, also connected to ground by a switch Sl controlled by $\phi_1$. The capacitors have binary weighted values—i.e. the capacitance of the capacitor CPi is $2^i.C$ where C is the value of the smallest capacitor CP0. The node ND is also connected via a switch SO controlled by $\phi_o$ to the input of a high gain inverting amplifier OA which has a negative feedback path consisting of a capacitor $C_F$ in parallel with a switch SlF controlled by $\phi_1$.

During clock phase 1, the capacitor $C_F$ is discharged via SlF. Also, each capacitor CPi is charged or discharged via switches Sli and Sl to the voltage (0 or $V_R$) determined by the respective switch CSi. During clock phase $\phi_o$, the total charge on the capacitors CPi $$Q = \sum_0^{w-1} b_i \cdot V_R \cdot 2^i \cdot C = CV_R \sum_0^{w-1} b_i 2^i$$

is transferred to the capacitor $C_F$ so that the output of the converter is $$V_0 = \frac{C}{C_F} V_R \sum_{i=0}^{w-1} b_i 2^i \quad (1)$$

Figure 4:
FIG. 4 is a block diagram of a further embodiment of filtered digital-to-analogue converter.
Figure 4:
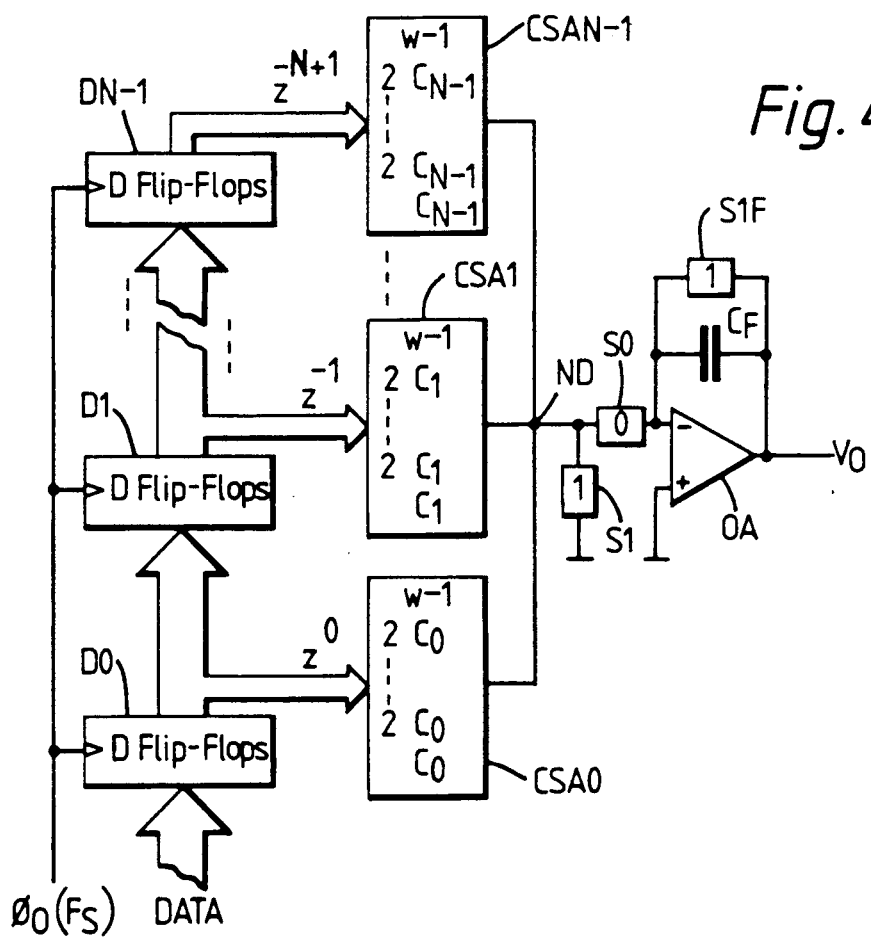

Although converters of the design shown in FIG. 3 could be used directly to replace the converters X0...XN−1 of FIG. 2, a more practical arrangement is shown in FIG. 4 where the node ND, switches SO, Sl, SlF, capacitor $C_F$ and amplifier OA are common to the N converters. The flip-flops are as in FIG. 2, whilst the capacitor/switch array units CSA0...CSAN−1 correspond to the components enclosed in the broken line box in FIG. 3. In this embodiment, the capacitor values in each array are chosen to weight the contribution of that array to the final output by a factor corresponding to the appropriate one of the desired filter coefficients $h_0 \ldots h_{N-1}$.

To accommodate negative coefficients, the array is modified by the transposition of the clock phases by transposition of switches SOi and Sli. The nth array (n=0, ..., N−1) has capacitors with values $2^i.C_n$ where $C_n = |h_n|.C^*$ ($C^*$ being a constant), so that the contribution of this array to the total output voltage is $$V_{0,n}(z) = \frac{h_n}{C_F} C^* V_R \left( \sum_{i=0}^{w-1} b_{i,n} \cdot 2^i \right) \cdot z^{-n} \quad (2)$$

where z is the z-transform variable and $b_{i,n}$ is the value of the ith bit of the digital word at the output of the nth D-type flip-flop. The contribution of all N words for an FIR filter of length N is $$V_0(z) = \sum_{n=0}^{N-1} V_{0,n}(z)$$

-continued $$V_0(z) = \frac{V_R}{C_F} \cdot \sum_{n=0}^{N-1} \left[ h_n \cdot C^* \left( \sum_{i=0}^{w-1} b_{i,n} \cdot 2^i \right) \cdot z^{-n} \right]$$

If we set $C_F = 2^w.C^*$ then the output voltage is $$V_0(z) = V_R \sum_{n=0}^{N-1} h_n \cdot \left( \sum_{i=0}^{w-1} b_{i,n} \cdot 2^{i-w} \right) \cdot z^{-n}$$

If the smallest capacitance value $C_n$ is C, and the corresponding value of $h_n$ is $h_{n\ min}$ then the remaining capacitor values are given by $$C_n = \frac{|h_n| \cdot C}{|h_n|_{min}}$$

and $$C_F = \frac{2^w \cdot C}{|h_n|_{min}}$$

Since $C_F$ is usually the largest capacitor in the circuit, we obtain a maximum capacitance spread of $$\frac{C_F}{C_{n\ min}} = \frac{2^w}{|h_n\ min|}$$

and a total capacitor area of $$C_{total} = \frac{C}{|h_n|_{min}} \left[ 2^w + (2^w - 1) \cdot \sum_{n=0}^{N-1} |h_n| \right]$$

For an example of FIR filtering function with equal coefficients and unity DC gain ($h_n = 1/N$, n=0, ..., N−1) the above results lead to a capacitance spread of $C_{spread} = N \cdot 2^w$ and a total capacitor area of $C_{total} = N \cdot (2^{w+1} - 1) \cdot C$.

The embodiment of FIG. 4 requires (N·w+1) capacitors and (2N·w+3) switches, increasing with both the bit resolution w of the conversion and the length N of the desired filter impulse response. This means that, even for a medium bit resolution and short filter responses, the resulting silicon area required for an integrated circuit implementation can become rather large. An alternative converter is however now proposed, having reduced number of capacitors and switches.

Figure 5:
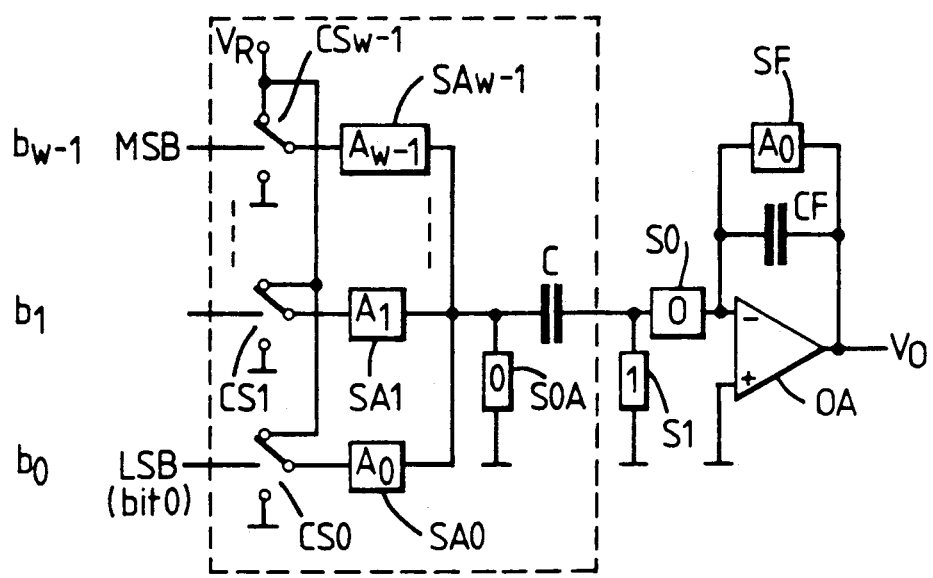
FIG. 5 is a circuit diagram of a digital-to-analogue converter unit according to a further embodiment of the invention.

FIG. 5 shows a switched capacitor digital-to-analogue converter (without filtering). It can be employed alone, or, as will be described in more detail below, can be used to replace the converters X0...XN−1 of FIG. 2, in the same manner as was the converter of FIG. 3.

Figure 7:
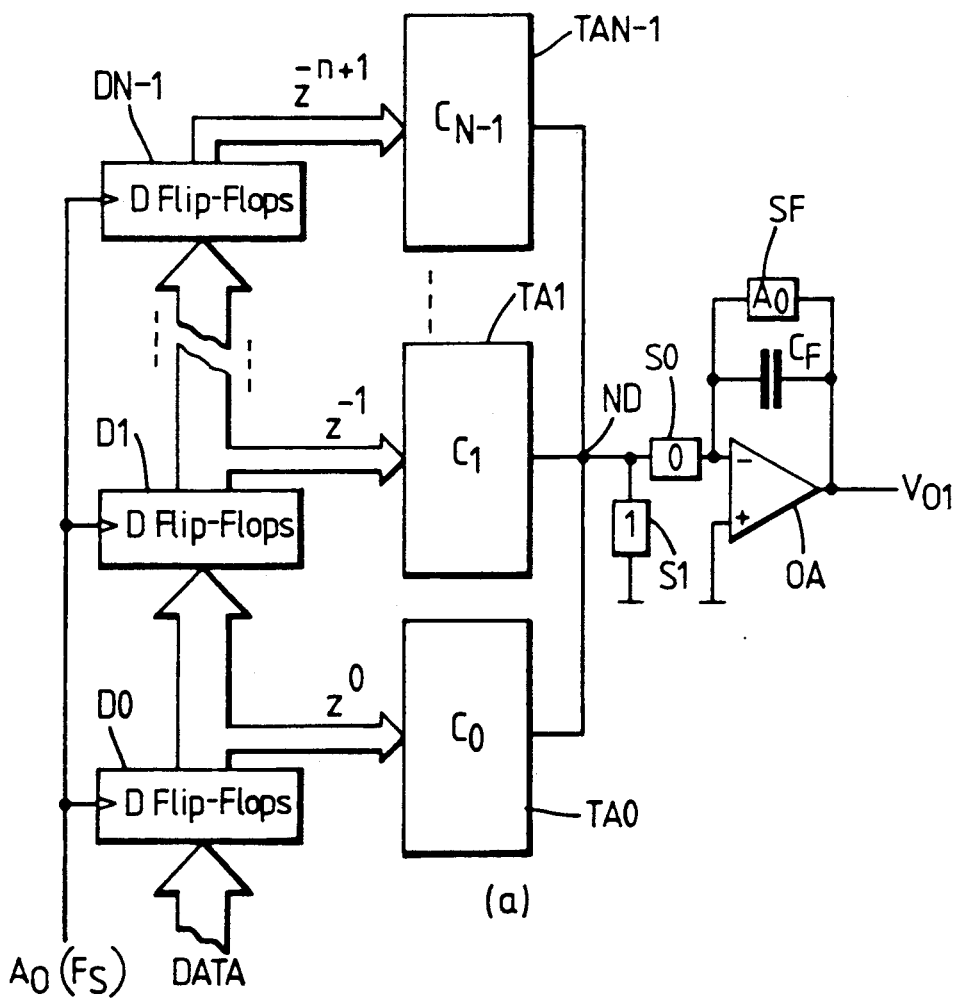
FIG. 7 is a block diagram of a filtered digital-to-analogue converter employing converter units of the type shown in FIG. 5.

Input bits $b_i$ and switches CSi perform the same functions as in FIG. 3, as do switches Sl, SO, SF, capacitor $C_F$ and amplifier OA. However, the capacitors CPi and switches SOi are replaced by a single capacitor CP and switch SOA. The binary weighting of contribution of the w input bits is instead determined by the waveforms applied to the switches Sli (now designated SA0...SAi...SAw−1). Effectively the capacitor CP is multiplexed between the input bits. A set of switching waveforms $\phi'_1$, $\phi'_o$ and $A_0 \ldots A_{w-1}$ for w=3 is illustrated in FIG. 7.

Note that there are now $2^{w-1}$ clock pulses $\phi'_1$ (or $\phi'_o$) in one conversion period. The waveforms $A_o \ldots A_{w-1}$ contain 1, 2, 4 etc pulses synchronous with $\phi_1$—i.e. in general the waveform $A_i$ contains $2^i$ pulses. At the beginning of each conversion period, the feedback capacitor $C_F$ is reset by the switch SF controlled by pulse $A_o$. Pulse $A_o$ also closes switch $A_o$ and the capacitor CP assumes a voltage of 0 $V_R$ according to the state of bit $b_o$. On the following clock pulse $\phi'_o$ this charge is transferred to $C_F$. This process is repeated by pulse $A_l$ for bit $b_l$, however, this occurs twice, as $A_l$ contains two pulses, and so forth, the D/A conversion being performed sequentially from bit $b_o$ to bit $b_{w-1}$. The converted output is available during pulse $\phi'_o$ following the last pulse of $A_{w-1}$, prior to resetting of $C_F$ by a further pulse $A_o$. Of course it is not actually necessary that the bits be processed in any particular sequence, or indeed that all the pulses for one particular bit be generated before those of another bit (though obviously the pulses must not coincide).

The equivalent bit voltage $V_i$ corresponding to each bit of the digital word is determined by the *number* of pulses of the corresponding switching waveform $A_i$ and can thus be expressed by $$V_i = V_R \cdot b_i \cdot 2^i$$

and therefore the converted output is $$V_0 = \frac{C}{C_F} V_R \sum_{i=0}^{w-1} b_i \cdot 2^i$$

Assuming $[V_{Omax}/V_R \cdot (1-2^{-N})] = 1$, we can easily see from the above expression that the capacitance spread of the converter in FIG. 5 is equal to the capacitance spread of the conventional converter of FIG. 3, i.e. $(C_F/C) = 2^w$. However, the total capacitor area is now only $(2^w + 1) \cdot C$, compared to $2^{w+1} \cdot C$ in a conventional converter, and the total number of capacitors has also been reduced from $(w+1)$ to only 2. An additional significant advantage of this new architecture is that, unlike conventional converters, the accuracy of the capacitance ratio $C_F/C$ does not affect the required bit resolution, which depends solely on the *number* of time slots of each switching waveform. Thus, we can easily apply to the converter of FIG. 5 a number of well known design techniques than can significantly reduce the capacitance spread in a switched-capacitor network (e.g. capacitive-T network), even though this also brings an inherent reduction of the resulting accuracy of the capacitance ratios. This makes it practical to implement high resolution converters using simple switched capacitor networks occupying a small area of silicon.

It is observed that, for a given maximum switching frequency, the conversion rate (and hence sampling rate of the digital words that can be accommodated) is reduced by a factor of $(2^w - 1)$ relative to FIG. 3; however the reduction in capacitor area and required capacitance ratio accuracy make this embodiment particularly useful for high resolution conversions at lower frequency.

Figure 6:
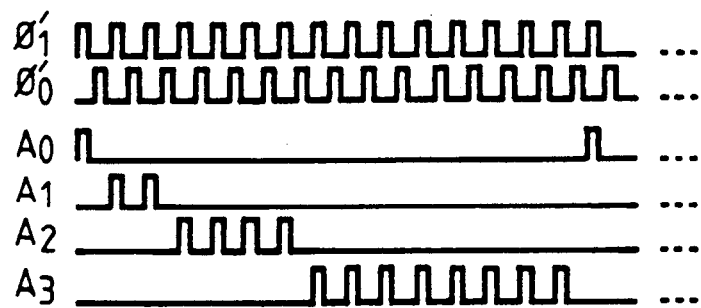
FIG. 6 illustrates the clock and switching pulses employed in the unit of FIG. 5.
Figure 8:
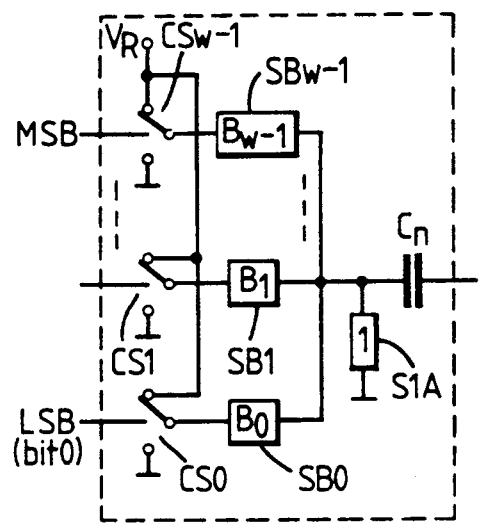
FIG. 8 is a modified version of part of FIG. 5, for implementing negative filter coefficients.

An implementation of a combined digital-to-analogue converter and FIR filter based on the binary-weighted time slot array architecture described above is illustrated in FIG. 7. The flip-flops Dn are shown as for FIGS. 2 and 4. The converters Xn of FIG. 2 are replaced by time slot arrays TA0 to TAN-1, followed by common components SI, SO, OA, $C_F$ and SF which are identical to those shown in FIG. 6. Each time slot array TAi is either in the form indicated in the dotted rectangle in FIG. 6 (for positive $h_n$) or, for negative $h_n$ is structurally the same but is supplied with different pulses. Thus switches SAn supplied by pulses $A_n$ and switch SOA supplied with pulses $\phi'_o$ are replaced by switches SBn and SIA supplied with pulses $B_n$ and $\phi'_1$, as shown in FIG. 8. Pulses $B_n$ $(n=0 \ldots n-1)$ take the same form as pulses $A_n$ but are synchronous with $\phi'_o$ instead of $\phi'_o$.

As in the case of the architecture of FIG. 2, we can easily see that the normalised output voltage conversion level corresponding to all N digital words is also expressed by $$\frac{V_0(z)}{V_R(1-2^{-N})} = \frac{1}{C_F} \sum_{n=0}^{N-1} \left[ C_n \cdot \left( \sum_{i=0}^{w-1} b_{i,n} 2^i \right) \cdot z^{-n} \right]$$

where $C_n = \frac{|h_n| \cdot C_F}{2^w}$ in order to preserve the gain constant of the FIR transfer function. After normalisation, we obtain $$C_{n\ min} = C$$

$$C_n = \frac{|h_n|}{|h_{n\ min}|} \cdot C$$

$$C_F = \frac{2^w \cdot C}{|h_{n\ min}|}$$

yielding a maximum capacitance spread of $$C_{spread} = C_F/C = \frac{2^w}{|h_{n\ min}|}$$

and $$C_{total} = \frac{C}{|h_{n\ min}|} \left( 2^w + \sum_{n=0}^{N-1} h_n \right)$$

for the total capacitor area. For many practical situations where the FIR filter is designed such that $$\sum_{n=0}^{N-1} h_n = 1$$

the above expression for $C_{total}$ shows a reduction of about 50% over the total capacitor area obtained with the previous realisation. Two additional advantages of the architecture with binary-weighted time slot arrays are obtained firstly with respect to the total number of capacitors, which has been reduced from $(N \cdot w + 1)$ to only $(N+1)$, and, secondly, with respect to the required capacitance ratio accuracy of the impulse response coefficients of the FIR filter.

Figure 9:
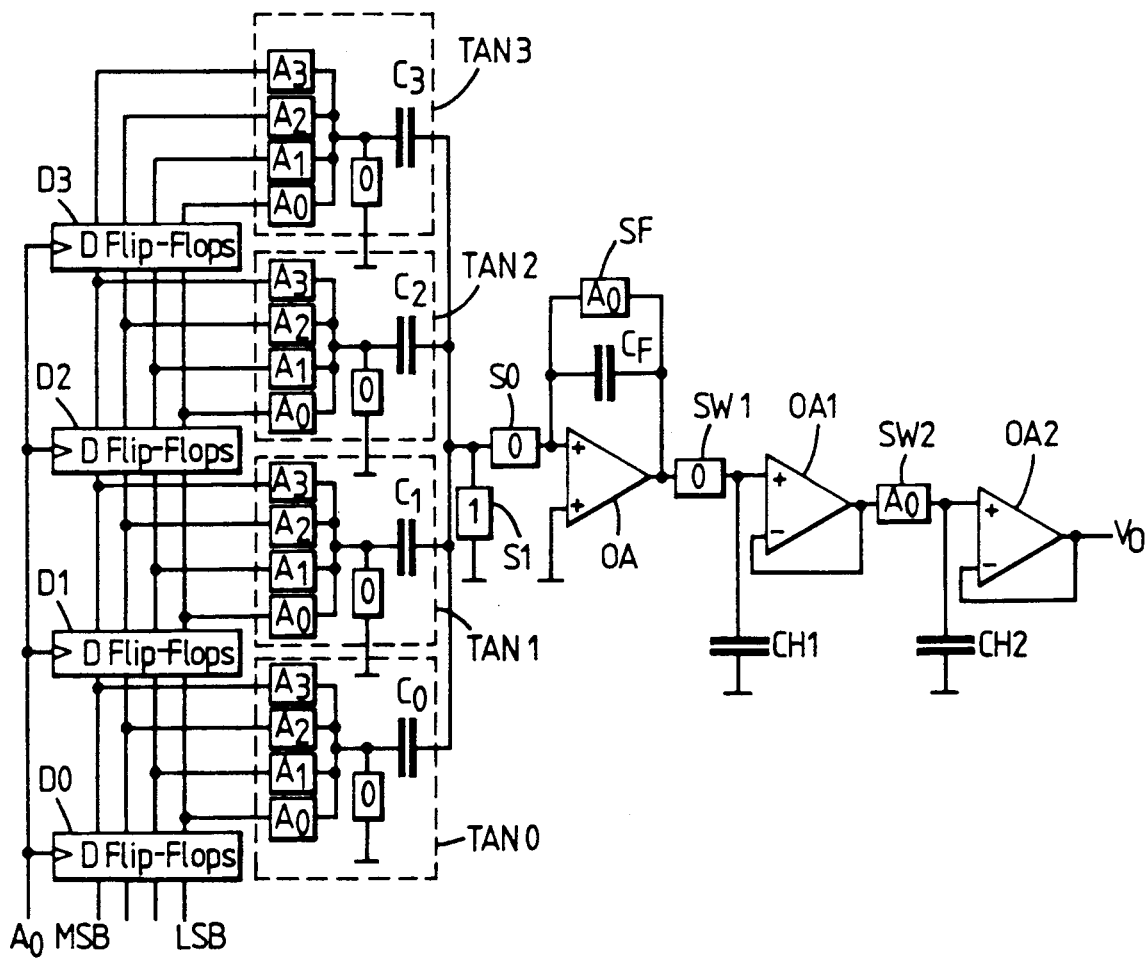
FIG. 9 illustrates a practical implementation of the converter of FIG. 7.
Figure 10:
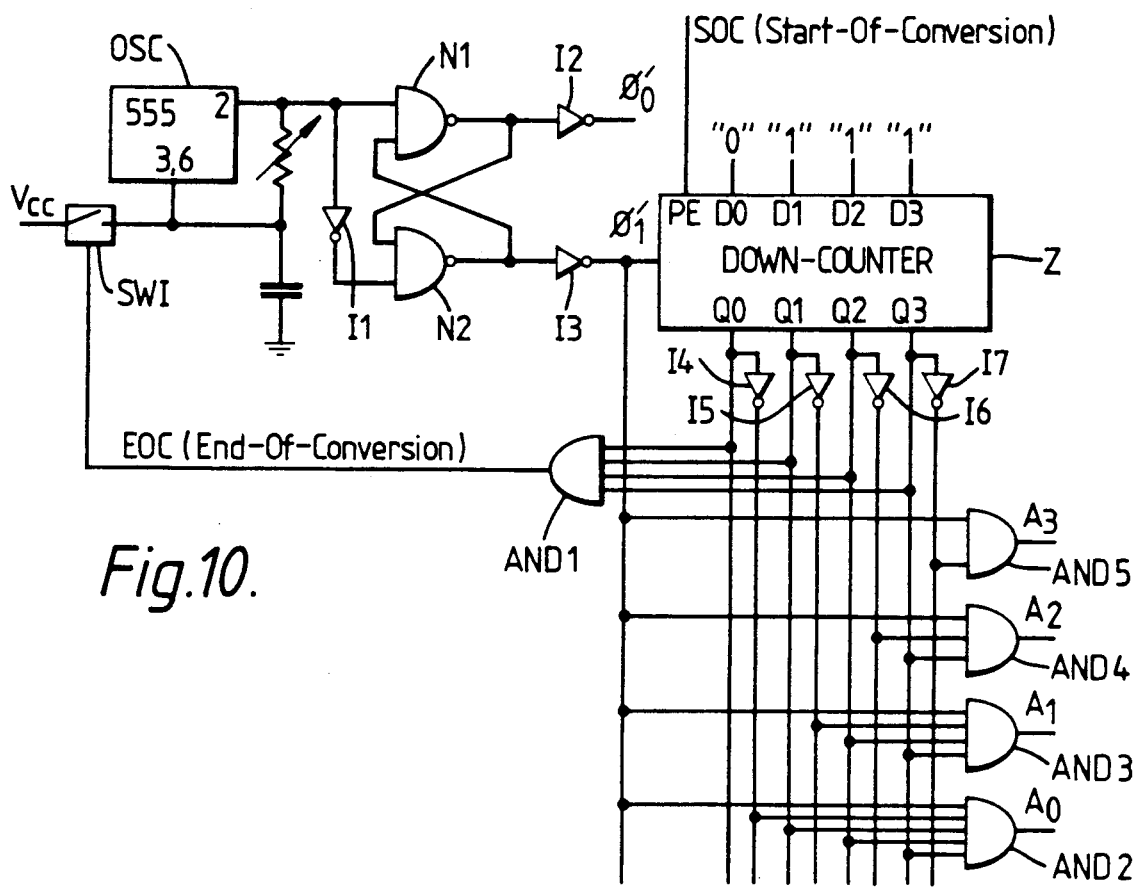
FIG. 10 is a block diagram of a pulse generator for driving the converter of FIG. 9.

FIGS. 9 and 10 illustrage a simple practical implementation of the type of combined digital-to-analogue converter described above with reference to FIG. 7. It has 4-bit resolution and four equal FIR filter coefficients. The filter impulse response (in z-transform notation) is $$H(z) = \tfrac{1}{4}(1 + z^{-1} + z^{-2} + z^{-3}).$$

There are four 4-bit wide D-type flip-flops D0, D1, D2, D3. Note that the first of these is (as in the other figures) not strictly necessary but is included to ensure accurate timing. Also the switches CSi are omitted (on the basis that, for a 4-bit implementation, the voltages output directly from the flip-flops are themselves sufficiently consistent). There are three stages TAN0...TAN3, of the type shown in FIG. 5, with equal capacitor C0...C3 (=capacitance C) representing the four equal coefficients. Components S0, S1, SF, CF and OA are as shown in FIG. 5, whilst two simple sample and hold circuits SH1 CH1, OA1, SH2, CH2, OA2 are included to sample the output ($A_0$ being applied to switches SH1, SH2) when conversion is completed, to eliminate any output transients during conversion. $C_F$ is equal to 64C for $V_{omax}/V_R(1-2^{-N}) = 1$.

The switching waveforms $A_0, A_1, A_2, A_3$ are generated by means of the generator shown in FIG. 10. A square-wave oscillator OSC drives a non-overlapping phasing generator consisting of an invertor I1, cross-coupled NAND gates N1, N2, and inverters I2, I3 to produce pulses $\phi'_0, \phi'_1$. A modulo 8 binary down-counter Z1 is clocked by $\phi'_1$. The '1111' state is designated as an idle-state in which the counter is locked by an and-gate AND1 which decodes this state to an end of conversion pulse EOC and inhibits clock pulses via a switch SW1 in the oscillation circuit.

The generation of the required $(2^w - 1) = 15$ pulses of the switching waveforms $A_0 ... A_3$ is indicated by an external pulse SOC (synchronous with the digital input data to be converted) which is applied to a parallel load input PE of the counter Z1 to load count '1110' into the counter.

Figure 11:
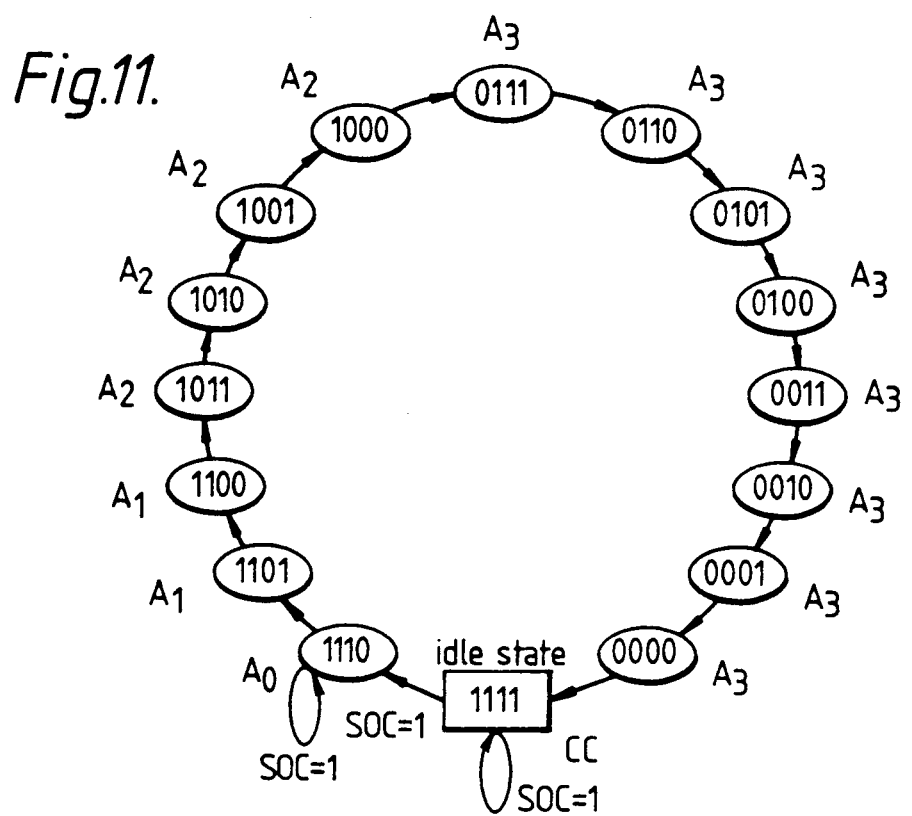
FIG. 11 is a state diagram illustrating the operation of the generator of FIG. 9.

The counter is then decremented by pulses $\phi'_1$ through its states to 000, during which period the counter states are decoded by inverters I4...I7 and and-gates AND1...AND4 to produce the pulses $A_0$...$A_3$ as illustrated in the sequence diagram in FIG. 11. The sixteenth pulse $\phi_1'$ returns the counter to the '1111' state where it remains locked until a further start pulse SOC is received.

Note that in this converter, pulses $B_i$ are not required (since the filter coefficients are all positive) but could of course be generated by a second counter and decoding logic similar to the arrangements for $A_i$.

A discrete component version of this converter can be constructed using amplifiers type LF353, CMOS analogue switches type CD4016, and standard CMOS logic circuits, although in practice an integrated circuit implementation is to be preferred.

Typical capacitor values are C=40 pF and $C_F$=2700 pF (with ±0.2% of the nominal values) may be used.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

We claim:

1. An apparatus for producing a filtered analogue output signal from a digital signal, said digital signal being in the form of a sequence of digital signal samples each having a plurality of bits comprising:
   (a) digital delay means receiving a first sequence of digital signal samples and producing further sequences of digital signal samples, each said further sequence being a replica of said first sequence delayed with respect thereto by a respective delay period, thereby making available a plurality of earlier samples simultaneously with each sample of said first sequence;
   (b) conversion and weighting means comprising a plurality of switched capacitor arrangements, each for receiving a respective one of said sequences of digital signal samples; wherein each said switched capacitor arrangement has a plurality of capacitors with values weighted according to the significances of respective bits of said samples and switching means for supplying, in dependence on the states of bits of each received sample, charges to said capacitors, thereby forming a total charge dependent on the value represented by said sample, said total charges each being weighted by a respective one of a set of coefficients corresponding to a desired filter response; and
   (c) common summing means for forming an analogue output sequence representing the sum of the charges from the individual switched capacitor arrangements.

2. An apparatus accordance to claim 1, wherein said capacitors in at least one of said switched capacitor arrangements differ in value from the corresponding said capacitors in another of said switched capacitor arrangements, such as to weight the charges by factors corresponding to the desired filter response.

3. An apparatus for producing a filtered analogue output signal from a digital signal, said digital signal being in the form of a sequence of digital signal samples each having a plurality of bits comprising:
   (a) digital delay means receiving a first sequence of digital signal samples and producing further sequences of digital signal samples, each said further sequence being a replica of said first sequence delayed with respect thereto by a respective delay period, thereby making available a plurality of earlier samples simultaneously with each sample of said first sequence;
   (b) conversion and weighting means comprising a plurality of switched capacitor arrangements, each for receiving a respective one of said sequences of digital signal samples; wherein each said switched capacitor arrangement has a single capacitor and switching means for supplying, in dependence on the states of the bits of each received sample, charges to said capacitor, said switching means being arranged to supply a predetermined quantity of charge to the capacitor a respective different number of times such that the charges supplied for respective bits of the sample are weighted according to the significances of those bits, thereby forming a total charge dependent on the value represented by said sample, said total charges also being weighted by a respective one of a set of coefficients corresponding to a desired filter response; and
   (c) summing means comprising common means for forming an analogue output sequence representing the sum of the charges from the individual capacitor arrangements.

4. An apparatus according to claim 3, wherein said capacitor in at least one of said switched capacitor arrangements differs in value from the corresponding said capacitor in another of said switched capacitor arrangements, such as to weight the charges by factors corresponding to the desired filter response.

5. A method for producing a filtered analogue output signal from a digital signal, said digital signal being in the form of a sequence of digital signal samples each having a plurality of bits comprising the steps of:
   (a) digitally delaying a first sequence of digital signal samples and producing further sequences of digital signal samples, each said further sequence being a replica of said first sequence delayed with respect thereto by a respective delay period, thereby making available a plurality of earlier samples simultaneously with each sample of said first sequence;
   (b) converting and weighting said further sequences of digital samples using a plurality of switched capacitor arrangements; wherein each said switched capacitor arrangement has a plurality of capacitors with values weighted according to the significances of respective bits of said samples and charges are supplied to said capacitors in dependence on the states of bits of each received sample, thereby forming a total charge dependent on the value represented by said sample, said total charges each being weighted by a respective one of a set of coefficients corresponding to a desired filter response; and
   (c) producing a filtered analogue output by forming the sum of the charges from all of the individual switched capacitor arrangements.

6. A method for producing a filtered analogue output signal from a digital signal, said digital signal being in the form of a sequence of digital signal samples each having a plurality of bits comprising the steps of:
   (a) digitally delaying a first sequence of digital signal samples and producing further sequences of digital signal samples, each said further sequence being a replica of said first sequence delayed with respect thereto by a respective delay period, thereby making available a plurality of earlier samples simultaneously with each sample of said first sequence;
   (b) converting and weighting said further sequences of digital samples using a plurality of switched capacitor arrangements; wherein each said switched capacitor arrangement has a single capacitor and switching means for supplying, in dependence on the states of bits of the samples received sample, charges to said capacitor, said converting and weighting steps further including the step of operating said switching means of said arrangements to supply charge to the capacitor for respective different total switching times such that the charges supplied are weighted according to the significances of respective bits of the sample, thereby forming a total charge dependent on the value represented by said sample, said total charges each being weighted by a respective one of a set of coefficients corresponding to a desired filter response; and
   (c) producing a filtered analogue output by forming the sum of the charges from the individual switched capacitor means.

7. A switched-capacitor digital-to-analogue converter comprising:
   inputs for receiving signals representing respective bits of a digital signal;
   means responsive to each of said inputs for generating a respective switching waveform, each waveform containing a different predetermined number of pulses, said number corresponding to the significance of the respective input;
   a capacitor for receiving charge;
   a plurality of switching means, each responsive to receipt of a pulse from said means for generating, for supplying a predetermined quantity of charge to said capacitor;
   control means responsive to the values of each of said input bits having a first or second binary value to respectively enable or disable the supply of charge by the pulses generated for that bit; and
   means for generating an analogue output signal representing the sum of the charges supplied.

8. An apparatus for producing a filtered analogue output signal from a digital signal, said digital signal being in the form of a sequence of digital signal samples each having a plurality of bits comprising:
   (a) digital delay means receiving a first sequence of digital signal samples and producing further sequences of digital signal samples, each said further sequence being a replica of said first sequence delayed with respect thereto by a respective delay period, thereby making available a plurality of earlier samples simultaneously with each sample of said first sequence;
   (b) conversion and weighting means comprising a plurality of switched capacitor arrangements, each for receiving a respective one of said sequences of digital signal samples; each said switched capacitor arrangement having at least one capacitor and switching means for supplying, in dependence on the states of bits of each received sample, charges thereto, such that the total of said charges depends on the value represented by said sample; said totals each being weighted by a respective one of a set of coefficients corresponding to a desired filter response; and
   (c) summing means for receiving said charges from all said switched capacitor arrangements and forming an analogue output sequence representing the sum of said charges.

* * * * *